Jan. 30, 1968 M. I. NECHTOW 3,365,793

METHOD OF MAKING OXIDE PROTECTED SEMICONDUCTOR DEVICES

Filed Jan. 28, 1964

INVENTOR.
MARSHALL I. NECHTOW,
BY
Charles S. Haughey
ATTORNEY.

United States Patent Office 3,365,793
Patented Jan. 30, 1968

3,365,793

METHOD OF MAKING OXIDE PROTECTED SEMICONDUCTOR DEVICES

Marshall I. Nechtow, Balboa Island, Calif., assignor to Hughes Aircraft Company, Culver City, Calif., a corporation of Delaware Filed Jan. 28, 1964, Ser. No. 340,621
7 Claims. (Cl. 29—578)

This invention relates to the production of oxide-protected, passivated semiconductor devices, and more particularly to a means for forming, and making lead attachments to, impurity-doped regions of semiconductor materials.

Oxide protective films over exposed edges of P-N junctions are desirable, but have required extensive or complicated manufacturing procedures, such as masking or photochemical techniques, to produce. This invention provides for forming an oxide protective layer on a semiconductor surface, then selectively forming a diffused region thereunder, opening an aperture in the oxide layer without uncovering the edge (P-N junction) of the region, and making lead attachments to the diffused region without use of photochemical techniques, masking, or special jigs to locate the diffused region.

For consideration of what I believe to be novel and my invention, attention is directed to the following portion of this specification including the drawing, which describes the invention, and the manner and process of making and using it.

Figure 2:
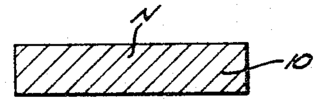
FIGS. 2–8 illustrate a stepwise process for producing a semiconductor diode according to the best mode contemplated by me of carrying out this invention.

According to the process illustrated by FIGS. 2–8, an oxide layer or film 11 free from conductivity type determining impurities is formed on a surface of a semiconductor crystal 10 to protect or passivate the same; an impurity, or impurity containing material 12 which will alloy into the film and diffuse into the crystal, and which will so change the alloyed area of the film as to make it subject to preferential removal, as by selective etching, is placed on the film and heated to alloy it into the film and further heated to diffuse it into the crystal; the impurity-modified film region 13 is then selectively removed; and an electrical connection or lead 16, 17 is attached to the diffused area without removing or disturbing the passivating film from the surface area at which the diffused crystal region joins the original crystal material. When the diffused region has a changed conductivity type, the film protects the P-N junction surface, and a second electrical connection or lead to the undiffused crystal portion completes a diode structure.

Figure 1:
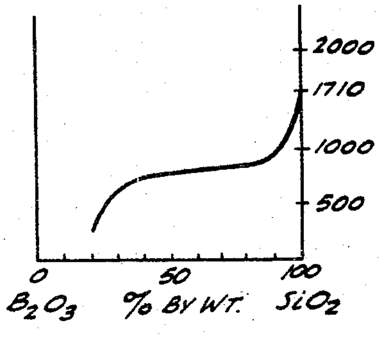
FIG. 1 is a partial phase diagram of material which may be used to practice this invention.

The term "alloy" is used herein to refer to a process (or its product) which takes place in oxide, or glass forming, materials in much the manner of well known metal alloying. In the example illustrated herein, silicon dioxide ($SiO_2$) is formed as a film on a semiconductor body, and a second oxide, in this example boron trioxide ($B_2O_3$), is placed thereon and heated. As shown in FIG. 1, a partial phase diagram for $B_2O_3$-$SiO_2$, at some temperature above about 400° C. a liquid can be formed whose boron trioxide concentration will depend on the temperature, being lower at higher temperatures. Thus, upon heating an $SiO_2$ film in contact with $B_2O_3$, at a temperature above about 400° C., an alloy will be formed having the appearance of a liquid, and as temperature is increased the alloy becomes more rich in $SiO_2$, and the alloy region spreads. The extent of the alloy region so formed thus depends upon relative quantities of $B_2O_3$ and $SiO_2$ and on temperature and time. Time is required for the alloy to form, both to penetrate the $SiO_2$ film to its substrate material and to spread laterally.

As is well known, $B_2O_3$ is water soluble, and $SiO_2$ is substantially water insoluble. Alloys of $B_2O_3$ and $SiO_2$, which can be considered to be a boron glass, are more easily etched with higher boron trioxide content, and when alloyed reasonable selectivity in etch-removal of the alloy material from $SiO_2$ is obtainable. For example, when $B_2O_3$ and $SiO_2$ are alloyed at temperatures up to about 1200° C., reasonable selectively in removal of the alloy from $SiO_2$ is obtainable in hot (150° C.) concentrated potassium hydroxide (KOH). Higher alloying temperatures increase the $SiO_2$ content of the alloy, as shown by the curve in FIG. 1, and selectively of the etch decreases accordingly.

When alloying $B_2O_3$ and $SiO_2$, the alloy tends to spread laterally more rapidly at higher temperatures, apparently due to higher fluidity and higher solubility of $SiO_2$ in the alloy phase. Below 900° C. this spreading is not excessive, and accordingly temperatures not greatly exceeding 900° C. are preferred for this alloying to maintain control of the size of the alloy area.

During the alloying, the alloy appears to have a liquid front, and it retains a definable edge, or perimeter, so that the change in $B_2O_3$ content is sharp and selective etching is effective to remove $B_2O_3$ and produce a sharply defined edge in the $SiO_2$ film. Although both phases are etched the rate is sufficiently preferential to remove the $B_2O_3$ containing alloy while leaving a protective film over the edge of the P-N junction formed by diffusion of boron from the alloy into the substrate crystal and laterally under the oxide film. The alloy area may be several times the thickness of the original $SiO_2$ film, and the etch rates obtainable will satisfactorily preferentially remove the alloy. With films initially of 2000 A. thickness, $B_2O_3$ fibers of about the same thickness are preferred; however, if the $B_2O_3$ is substantially thicker than the $SiO_2$ film, the alloying process tends to spread out the alloy to cover larger areas than desired. Alloys of about 20% $B_2O_5$ balance $SiO_2$ may be selectively etched, so a 200 A. fiber of $B_2O_5$ may be used on a 1000 A. film of $SiO_2$. Substantially thinner $B_2O_3$ fibers will produce an $SiO_2$-$B_2O_3$ alloy which is more difficult to preferentially etch to the silicon substrate. A thermally grown $SiO_2$ film on silicon semiconductor material, usually grown at about 1100° C. to 1350° C., is an effective mask against boron and other diffusants at temperatures up to 1350° C. The diffusion rate of boron into silicon is very slow at temperatures below 900° C. Thus the desired alloy area may first be formed at a lower temperature, and then a diffusion step at higher temperature, such as about 1100° C., will give excellent diffusion process control.

The above example of $B_2O_3$ with $SiO_2$ produces an alloy, or glass, containing boron which is then available as a P-type impurity source for diffusion into the substrate material. If an N-type source is desired, phosphorus in the form of $P_2O_5$ may be substituted with suitable adjustment in temperature and other process conditions.

Figure 3:
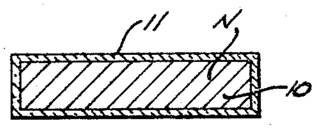
Figure 4:
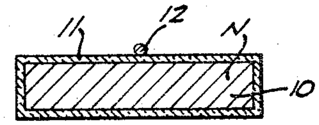
Figure 5:
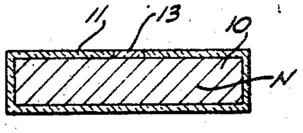
Figure 6:
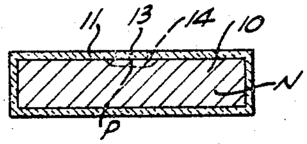

The preferred manner of using this invention is to start with an N-type semiconductor crystal 10, of silicon, germanium, or other suitable material, as shown in FIG. 2, and form thereon an oxide film 11 such as predominantly $SiO_2$, as shown in FIG. 3. For silicon crystals, the oxide film 11 may be grown, preferably about 2,000 A., or at least greater than about 1,000 A. thickness, although thicker films may be utilized, by heating the crystal in an oxidizing atmosphere as is well known in the art. A thin fiber or frit 12 of amorphous $B_2O_3$, or a boron containing material, is placed on the surface of the film 11 as shown in FIG. 4 and the assembly heated to over about 1,000° C., the temperature dependent upon alloy time, to fuse or alloy the $B_2O_3$ with the $SiO_2$ to form a borosilicate glass 13 as shown in FIG. 5. Boron is next diffused from the borosilicate glass 13 into the crystal to form a diffused region 14 of P-type, the junction of which with the N-type material extends under the $SiO_2$ film 11. A diffusion of about one hour at about 1,200° C. will produce a region 14 thickness of about 5 microns, as shown in FIG. 6. A thickness of about ½ to 5 microns may be preferred depending on the device frequency desired.

Figure 7:
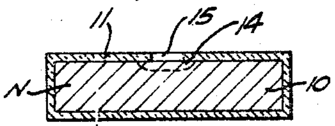

The borosilicate glass 13 is removed selectively, by a preferential etch which will remove borosilicate glass at a substantially faster rate than $SiO_2$, to open a window or aperture 15 in the $SiO_2$ film 11. Since fibers of $B_2O_3$ can be drawn to very fine sizes, such as about 2 microns diameter, the window 15 as shown in FIG. 7 may be produced about 2 microns diameter in the center of the area of the diffused P-type region 14, leaving the P-N junction protected by the $SiO_2$ film 11.

Figure 8:
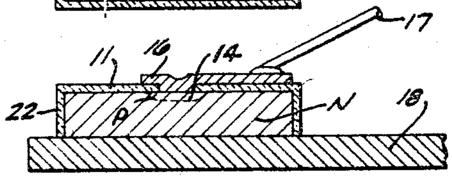

A metal film 16 of gold is next evaporated on to the surface of the film 11 including the aperture 15 to make ohmic contact therethrough with the P-type region 14, as shown in FIG. 8, and a lead 17 is connected thereto. The crystal is then mounted on a lead 18 in ohmic contact with the N-type portion of the crystal 10 to complete the diode device.

Although the P-N silicon diode above described is boron-diffused into N-type material, the reverse may be produced by substituting a P-type crystal 10, and using a phosphorus frit 12 to produce the less etch resistant glass from which phosphorus is diffused into the crystal to produce an N-type diffused region 14. A selective etch is again used to open the window 15, and well known technology completes the device as before illustrated. Where crystals other than silicon are used, the film 11 is preferably formed by decomposition, as by thermal decomposition of silanes, and diffusion temperatures and times will be adjusted according to the properties of the selected semiconductor material.

Figure 10:
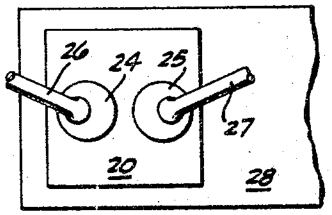
FIGS. 9 and 10 illustrate a transistor produced according to this invention.
Figure 9:
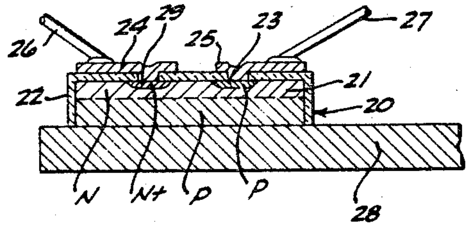

A transistor device may be produced as illustrated in FIGS. 9 and 10, by combining the boron and the phosphorus impurity sources if desired, and forming two windows in the film 22 on the crystal 20, using a P-type material for one and N-type for the other. Upon the diffusion step, one will augment the impurity type of the crystal, and the other will overcompensate it to change conductivity type and produce a P-N junction. The first will then be used for a base lead contact, the second for an emitter, and a third region, preferably produced at an earlier stage, will serve as a collector region and be ohmically attached to a mount serving as a collector lead.

Using, for example, a P-type silicon crystal 20 having a surface adjacent region 21 prediffused to convert it to N-type, an $SiO_2$ film 22 is grown thereon and respective fibers of phosphorus and boron materials laid thereon and heated to form phosphosilicate and borosilicate glasses. Additional heating for diffusion is used to produce an N+ region 29 adjacent the phosphorus containing glass and a boron-diffused P-type region 23 adjacent the boron containing glass. The two glasses are then removed selectively, as by a fluoride type etch, to open the windows, and separate areas of gold films 24 and 25 are formed thereon in ohmic contact with the crystal through the respective windows. Base and emitter leads 26, 27 are then attached, and a collector lead-mount 28 is ohmically connected to the other P-type region to complete the transistor structure.

What is claimed is:

1. A method of making a semiconductor device which comprises:
   forming on a surface of a semiconductor body an insulating film free from conductivity type determining impurities;
   alloying to a discrete area of the film an impurity containing material to form an alloy which may be selectively removed from the film;
   diffusing impurity from the alloy into the body;
   removing the alloy to open a window through the film;
   and making an electrical connection to said body through the window.

2. A method of forming a semiconductor diode device which comprises:
   forming a silicon oxide layer on a surface of a semiconductor crystal;
   alloying into a portion of said layer an impurity oxide material to form a selectively removable alloy;
   diffusing impurity material from the alloy to form a region of a conductivity type opposite that of the adjacent portion of the body;
   removing the alloy to open a window in the film; and
   depositing on at least a portion of the film and in the window a conductive layer in ohmic contact with the body through the window.

3. A method of making a semiconductor transistor device which comprises:
   forming a region of a first conductivity type adjacent a surface of a semiconductor body of a second conductivity type;
   covering at least a portion of the region with a film of insulating material free of conductivity type impurities;
   alloying to respective portions of the film first and second impurity materials to form alloy areas containing impurities of opposite conductivity type;
   diffusing the impurities from the respective alloys to form respective augmented and overcompensated regions in the body there adjacent;
   removing the alloys from the film; and
   making ohmic contact to the body through each of the windows in the film created by removal of the alloy.

4. A method according to claim 1 wherein the diffusing step is at a higher temperature than the alloying step.

5. A method according to claim 1 wherein the removing step is a preferential etching step.

6. A method according to claim 3 wherein the removing step is a preferential etching step.

7. A method of making a semiconductor device which comprises:
   forming on a surface of a semiconductor body an insulating film free from conductivity type determining impurities;
   alloying to a discrete area of the film a material which forms an alloy which may be selectively removed from the film; and
   removing the alloy to open a window through the film.

References Cited

UNITED STATES PATENTS

| | | | |
|---|---|---|---|
| 2,981,877 | 4/1961 | Noyce. | |
| 3,158,788 | 11/1964 | Last. | |
| 2,981,646 | 4/1961 | Robinson | 148—1.5 |

WILLIAM I. BROOKS, *Primary Examiner.*

JOHN F. CAMPBELL, *Examiner.*